(12) United States Patent
Wu et al.

(10) Patent No.: US 12,196,792 B2
(45) Date of Patent: Jan. 14, 2025

(54) NON-DESTRUCTIVE MEASUREMENT METHOD AND APPARATUS FOR THE TURN-TO-TURN RESISTIVITY DISTRIBUTION IN NON-INSULATION SUPERCONDUCTING COILS

(71) Applicant: SHANGHAI JIAOTONG UNIVERSITY, Shanghai (CN)

(72) Inventors: Wei Wu, Shanghai (CN); Li Lu, Beijing (CN); Jianghong Wan, Shanghai (CN)

(73) Assignee: SHANGHAI JIAOTONG UNIVERSITY, Shanghai (CN)

( * ) Notice: Subject to any disclaimer, the term of this patent is extended or adjusted under 35 U.S.C. 154(b) by 0 days.

(21) Appl. No.: 18/661,564

(22) Filed: May 10, 2024

(65) Prior Publication Data
US 2024/0302417 A1   Sep. 12, 2024

Related U.S. Application Data

(63) Continuation of application No. PCT/CN2024/083059, filed on Mar. 21, 2024.

(30) Foreign Application Priority Data

May 22, 2023 (CN) .......................... 202310581339.4

(51) Int. Cl.
*G01R 27/04* (2006.01)
(52) U.S. Cl.
CPC .................... *G01R 27/04* (2013.01)
(58) Field of Classification Search
CPC ...................................... G01R 27/04
(Continued)

(56) References Cited

U.S. PATENT DOCUMENTS

| 10,507,913 B2* | 12/2019 | Chan ...................... H01F 41/048 |
| 2022/0396681 A1* | 12/2022 | Bouloukakis ............. H01F 6/06 |

FOREIGN PATENT DOCUMENTS

| CN | 110794218 A | 2/2020 |
| CN | 111475904 A | 7/2020 |

(Continued)

OTHER PUBLICATIONS

Liu, Yingzhen, et al. "Study of contact resistivity of a no-insulation superconducting coil." Superconductor Science and Technology 34.3 (2021): 035009. (Year: 2021).*

(Continued)

*Primary Examiner* — Christopher P McAndrew

(57) ABSTRACT

A non-destructive measurement method and apparatus for the turn-to-turn resistivity distribution (TTRD) in non-insulation (NI) superconducting coils. The method includes: during the discharging or charging process, obtaining experimental values of voltage varying over preset time at different positions of the test coil; dividing the test coil into a plurality of measurement units and obtaining basic circuit elements; then constructing a preset equivalent circuit model including the basic circuit elements; based on the constructed equivalent circuit model, obtaining the first simulated values of voltage varying over preset time at different positions of the test coil; finally, determining the TTRD of the test coil based on the fitness value between experimental values and the first simulated values. When there is high fitness value between the first simulated values and experimental values, the TTRD corresponding to the first simulated values is considered as the TTRD within the test coil.

11 Claims, 14 Drawing Sheets

(58) Field of Classification Search
USPC .......................................................... 324/722
See application file for complete search history.

(56) References Cited

FOREIGN PATENT DOCUMENTS

| CN | 112904248 A | 6/2021 |
| CN | 112906268 A | 6/2021 |
| CN | 115774151 A | 3/2023 |
| CN | 116001586 A | 4/2023 |
| JP | 2006195608 A | 7/2006 |

OTHER PUBLICATIONS

Choi, Y. H., et al. "The effects of partial insulation winding on the charge-discharge rate and magnetic field loss phenomena of GdBCO coated conductor coils." Superconductor Science and Technology 25.10 (2012): 105001. (Year: 2012).*
Yang, D. G., et al. "Analytical and experimental investigation of electrical characteristics of a metallic insulation GdBCO coil." Review of Scientific Instruments 87.3 (2016). (Year: 2016).*
Yi Zhang, "Study on the Electromagnetic-Thermal Characteristics Analysis and Optimization Method of the No-Insulation High Temperature Superconducting Magnet", Chinese Excellent Doctoral Dissertation Full text Database, No. 3, Mar. 15, 2022, pp. 1-123, Entire document.

* cited by examiner

NON-DESTRUCTIVE MEASUREMENT METHOD AND APPARATUS FOR THE TURN-TO-TURN RESISTIVITY DISTRIBUTION IN NON-INSULATION SUPERCONDUCTING COILS

CROSS-REFERENCE TO RELATED APPLICATIONS

This application is a continuation of International Patent Application No. PCT/CN2024/083059 filed on Mar. 21, 2024, which claims the benefit of priority from Chinese Patent Application No. 202310581339.4, filed on May 22, 2023. The content of the aforementioned application, including any intervening amendments thereto, is incorporated herein by reference in its entirety.

TECHNICAL FIELD

The present application relates to the field of simulation technology for NI superconducting coils, particularly to a non-destructive measurement method and apparatus for the turn-to-turn resistivity distribution (TTRD) in non-insulation (NI) superconducting coils.

BACKGROUND ART

NI high-temperature superconducting (HTS) coils are coils wound with high-temperature superconducting tapes without any organic insulation layer between turns. Compared to traditional insulated coils, NI HTS coils have a more compact structure, stronger mechanical and cooling performance, and can provide higher magnetic field intensity, making them more widely applicable. However, the performance of NI HTS coils is significantly affected by the TTRD within the coils.

To measure the TTRD within the coils, conventional approaches often treat the entire coil as the test object to obtain the overall equivalent TTRD. However, this approach cannot capture the non-uniform TTRD within the coils. Yet, in simulation models, to predict the behavior of NI HTS coils, it is necessary to understand the non-uniform TTRD within the coils. Therefore, there is an urgent need for a measurement method to capture the non-uniform TTRD within NI HTS coils.

SUMMARY OF THE INVENTION

This present invention provides a non-destructive measurement method and apparatus for the TTRD in NI superconducting coils, for realizing the measurement of spatial distribution of uneven turn-to-turn resistivity of an NI HTS coil.

In a first aspect, this present invention provides a non-destructive measurement method for the turn-to-turn resistivity distribution (TTRD) in non-insulation (NI) superconducting coils, characterized in that the method include steps of:
obtaining multiple experimental values of voltage varying over preset time at different positions of the test coil during the discharging or charging process, wherein the test coil is an NI high-temperature superconducting (HTS) coil;
dividing the test coil into a plurality of measurement units and obtaining a plurality of basic circuit elements; each basic circuit element corresponds to a measurement unit and is used to represent the coil inductance of the measurement unit, the resistance of the coil in the direction of current flow in the measurement unit, and the turn-to-turn resistance of the measurement unit;
constructing an equivalent circuit model using the multiple basic circuit elements; and based on the equivalent circuit model, obtaining multiple first simulated values of voltage varying over preset time at different positions of the test coil; aligning the timestamps of the multiple first simulated values with the multiple experimental values;
determining the TTRD of the test coil based on the fitness value between the multiple experimental values and the multiple first simulated values; wherein the fitness value represents the fitness value between the multiple experimental values and the multiple first simulated values; and the TTRD is an array composed of turn-to-turn resistivity (TTR) within different measurement units and the numbers of the measurement units; the TTR within a measurement unit is obtained by multiplying the turn-to-turn resistance within the measurement unit by the turn-to-turn contact area within the measurement unit.

Optionally, when the test coil is an open-loop coil, comprising:
a DC power supply and a unit set formed by serially connecting the multiple basic circuit units;
the DC power supply supplies power to the equivalent circuit model;
the unit set includes a first interface and a second interface; the first interface represents the current flowing into the unit set, and the second interface represents the current flowing out of the unit set;
the input end of the DC power supply is connected to the first interface, and the output end is connected to the second interface.

Optionally, when the test coil is a closed-loop coil, comprising:
a DC power supply, a persistent current switch (PCS), and a unit set formed by serially connecting the basic circuit elements of the multiple measurement units;
the DC power supply supplies power to the equivalent circuit model; the PCS is used to make the unit set operate in a closed loop;
the input end of the DC power supply is connected to the first interface, and the output end is connected to the second interface; one end of the PCS is connected to the first interface, and the other end is connected to the second interface.

Optionally, obtaining multiple first simulated values of voltage varying over preset time at different positions of the test coil based on the equivalent circuit model, including:
inputting the multiple experimental values into the equivalent circuit model to obtain multiple TTR values for each measurement unit over the preset time; one experimental value corresponds to one TTR value;
averaging the multiple TTR values for each measurement unit over the preset time to obtain the first average TTR value for each measurement unit within the preset time;
inputting the first average TTR value for each measurement unit into the equivalent circuit model to obtain multiple first simulated values of voltage variation over preset time at different positions of the test coil.

Optionally, determining the TTRD of the test coil based on the fitness value between the multiple experimental values and the multiple first simulated values, including:
determining multiple first fitting residual values based on the multiple first simulated values and the multiple experimental values; one first fitting residual value is the difference between one first simulated value and one experimental value at the same time;

computing the sum of squares of the multiple first fitting residual values to determine the first objective function value; the first objective function value is positively correlated with the sum of squares of the multiple first fitting residual values;

when the first objective function value is not greater than a target error value, considering the first average TTR value for each measurement unit as the TTR within the measurement unit and determining the TTRD of the test coil;

when the first objective function value is greater than the target error value, iterating to obtain the second objective function value based on a preset iterative algorithm until the second objective function value is not greater than the target error value; considering the second objective function value corresponding to each measurement unit as the TTR within the measurement unit and determining the TTRD of the test coil;

the initial value of the preset iterative algorithm is the first average TTR value, and the independent variable range is the first preset resistivity range based on the first average TTR value; the second objective function value is used to represent the sum of squares of multiple second fitting residual values obtained by multiple second simulated values corresponding to the TTR and experimental values during the iteration process, where the second fitting residual value is the difference between one second simulated value and one experimental value at the same time.

Optionally, obtaining the second objective function value, comprising:

when extracting the target TTR from the second preset resistivity range, inputting the target TTR into the equivalent circuit model to obtain multiple second simulated values of voltage varying over preset time at different positions of the test coil corresponding to the target TTR;

determining multiple second fitting residual values based on the multiple second simulated values and the multiple experimental values;

computing the sum of squares of the multiple second fitting residual values to determine the second objective function value.

Optionally, obtaining multiple first simulated values of voltage varying over preset time at different positions of the test coil based on the equivalent circuit model; determining the TTRD of the test coil based on the fitness value between the multiple experimental values and the multiple first simulated values, including:

using a preset iterative algorithm to continuously extract the target TTR from the second preset resistivity range, inputting the target TTR into the equivalent circuit model to obtain multiple first simulated values of voltage varying over preset time at different positions of the test coil;

calculating multiple first fitting residual values between the multiple experimental values and the multiple first simulated values; one first fitting residual value is the difference between one experimental value and one first simulated value at the same time;

when the first objective function value is not greater than the target error value, the preset iterative algorithm stops, and the TTR corresponding to the first objective function value is considered as the TTR within the measurement unit, determining the TTRD of the test coil.

Optionally, dividing the test coil into a plurality of measurement units, including:

dividing the test coil based on the spatial measurement accuracy of the preset TTRD, wherein the test coil is divided perpendicular to the direction of winding of the test coil tape to obtain a plurality of measurement units;

the spatial measurement accuracy of the TTRD is positively correlated with the number of measurement units.

Optionally, the basic circuit element comprising:

an inductance, a turn-to-turn resistance, a superconducting layer resistance, and a matrix layer resistance;

the inductance value of the inductance represents the inductance value of the coil, with the first end of the inductance connected to the first end of the turn-to-turn resistance and the second end connected to the first end of the superconducting layer resistance and the first end of the matrix layer resistance;

the second end of the turn-to-turn resistance is connected to the second end of the superconducting layer resistance and the second end of the matrix layer resistance.

Optionally, the structure of the test coil, including one or more of the following: closed-loop, open-loop, single-pancake, double-pancake.

In a second aspect, this invention provides a non-destructive measurement apparatus for the TTRD in NI superconducting coils, comprising:

a memory and a processor coupled to the memory;

the memory stores program instructions, when executed by the processor, cause the apparatus to perform the method according to any method of first aspect.

In a third aspect, this invention provides a computer-readable storage medium comprising computer-readable instructions, wherein when the computer-readable instructions are executed on a computing device, the computing device performs the method according to any method of first aspect.

DETAILED DESCRIPTION OF EMBODIMENTS

Figure 1:
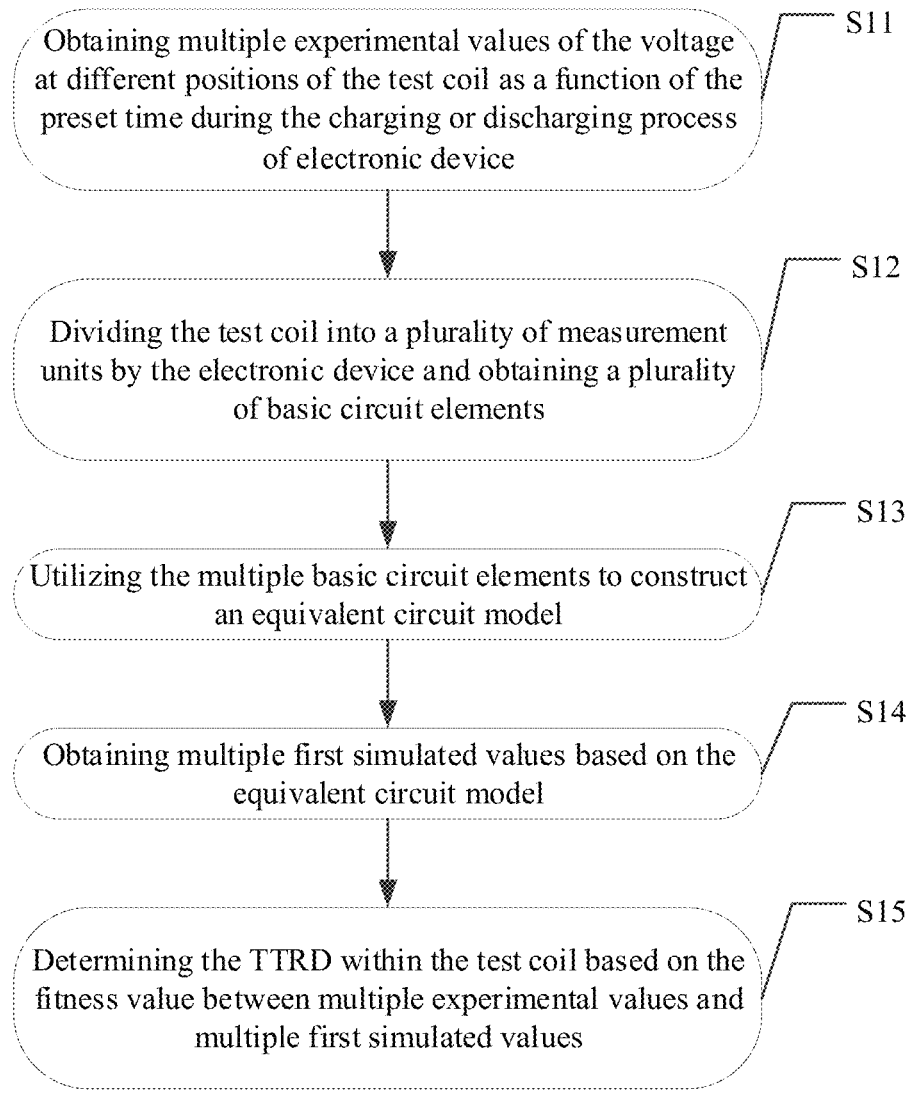
FIG. 1 is a flowchart of a non-destructive measurement method for the TTRD in NI superconducting coils provided in an embodiment of the present application.

To facilitate understanding of the technical solution of the embodiments of the present application by those skilled in the art, technical terms are introduced first.

NI HTS Coil: A coil directly wound from superconducting tapes without any insulation between the tapes, allowing the current to flow freely between turns. Compared to traditional insulated coils, NI HTS coils have a more compact structure, stronger mechanical and cooling performance, and can provide higher magnetic field intensity, making them more widely applicable.

However, NI HTS coils are accompanied by phenomena such as charging and discharging delays, as well as complex magnetic field errors and stress distribution issues. AC background fields can introduce turn-to-turn currents in NI coils, leading to turn-to-turn losses, dynamic resistance distribution different from insulated coils, and redistribution of coil currents and spatial magnetic fields. In addition, the behavior characteristics of closed-loop NI coils during transient processes involve significant non-uniform distribution of turn-to-turn currents and continuous redistribution processes. These typical behaviors of NI HTS coils are significantly influenced by the TTRD. Therefore, it is crucial to measure the TTRD within NI HTS coils. The structure of NI HTS coils includes one or more of the following: closed-loop, open-loop, single-pancake, or double-pancake.

The term "test coil" hereinafter refers to an NI HTS coil.

In conventional approaches, the entire test coil is often treated as the test object to obtain the overall TTRD, but this approach cannot capture the non-uniform TTRD within the test coil. However, merely setting a uniform distribution of TTR in simulation models is not sufficient to predict the behavior of sample NI coils in experiments. For example, during the transient process after the charging of the coil ends, the non-uniform distribution of TTR affects the relaxation characteristics during the redistribution of coil currents.

Based on this, the present application provides a measurement method for the TTRD within a coil. Considering the non-uniform characteristics of the TTRD within the coil, there are differences in the experimental values obtained at different positions of the test coil during charging or discharging processes. By dividing the test coil into a plurality of measurement units, each measurement unit obtains a different equivalent TTR. By adjusting the equivalent circuit model on electronic devices by the test coil, and using the equivalent circuit model, first simulated values corresponding to the experimental values at the same positions within the test coil can be obtained. When the experimental values fit the simulated values, it indicates that the TTR corresponding to the first simulated values (i.e., experimental values) under the equivalent circuit model is the TTR within the test coil.

The following section provides a detailed description of the measurement method for TTDR within the coil proposed in the present application.

Referring to FIG. 1, which provides a flowchart of a non-destructive measurement method for TTDR in NI superconducting coils according to an embodiment of the present application, the method comprises:

S11: obtaining multiple experimental values of the voltage at different positions of the test coil as a function of the preset time during the charging or discharging process by the electronic device.

The charging process refers to the entire process from the start of the current flow to the stable charging of the test coil. For example, an external power supply charges the test coil at a preset current rate (e.g., 0.5 A/s), and after a period (e.g., 60 s), the power supply maintains the output value at the preset steady current value (e.g., 30 A) for a preset holding time (e.g., 20 minutes), during which the charging process of the test coil stabilizes.

the discharging process refers to a process where the power supply to the test coil is suddenly turned off after a certain period (e.g., 30 minutes) of stable charging of the test coil until the charging process of the test coil ends, at which point the current inside the test coil is equal everywhere.

The voltage of the test coil is measured using voltage measurement components. Multiple voltage measurement components are arranged at different positions of the test coil to obtain multiple experimental values of the voltage varying over preset time at different positions of the test coil, and these experimental values are sent to the electronic devices for processing.

Figure 2:
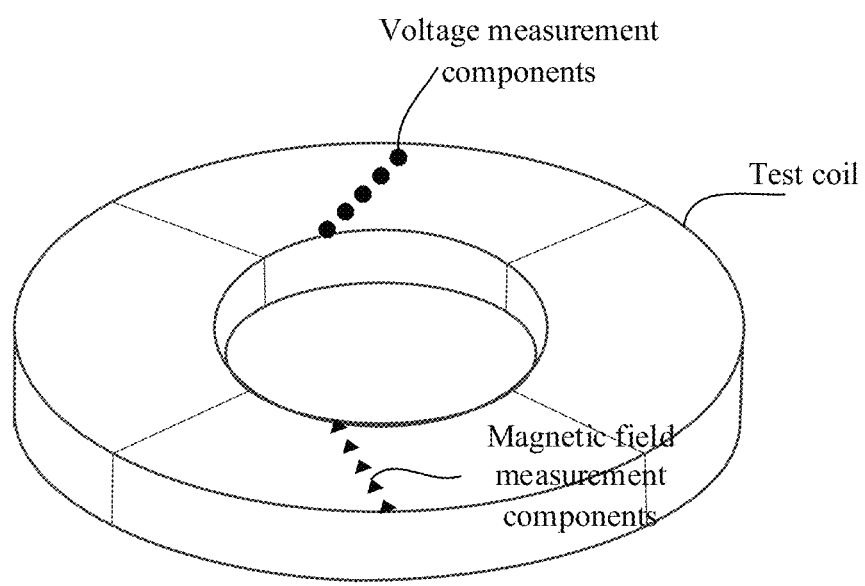
FIG. 2 is a schematic diagram of the layout of measurement components for a test coil provided in an embodiment of the present application.

Optionally, multiple voltage measurement components can be arranged in an array along the direction perpendicular to the winding direction of the tape within the plane of the test coil. For example, as illustrated in FIG. 2, which provides a schematic diagram of the arrangement of voltage measurement components for a test coil according to an embodiment of the present application, five first positions are preset along the direction perpendicular to the winding direction of the tape within the plane of the test coil, and five voltage measurement components are arranged at each first position.

Optionally, the present application may further arrange magnetic field measurement components for measuring the magnetic field distribution at different positions. For example, as shown in FIG. 2, five second positions are preset perpendicular to the winding direction of the tape, and five magnetic field measurement components are arranged at each second position. Other arrangements may also be employed in the present application, and the present application does not specifically limit the arrangement method. It should be noted that the number of voltage measurement components can be adjusted as needed, and the present application does not impose any limitations.

The experimentally obtained values in this embodiment represent the actual voltage values of the tested coil, serving as the basis for assessing the accuracy of obtaining the TTDR within the test coil.

S12: dividing the test coil into a plurality of measurement units by the electronic device and obtaining a plurality of basic circuit elements.

Optionally, depending on the spatial measurement accuracy of the preset TTRD, the test coil is divided into a plurality of measurement units along the direction perpendicular to the winding direction of the tape. For example, within the plane of the test coil, every 50 turns are designated as one measurement unit. The number of measurement units increases with the improvement of the preset measurement accuracy. The spatial measurement accuracy of the TTRD is positively correlated with the number of measurement units; the higher the spatial measurement accuracy, the more measurement units are needed.

Figure 3:
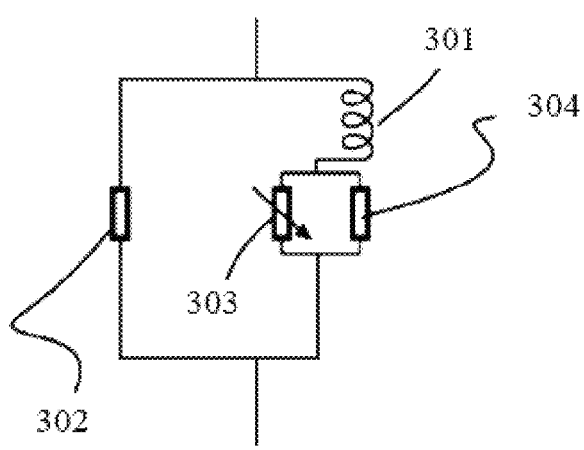
FIG. 3 is a schematic diagram of a basic circuit element provided in an embodiment of the present application.

Each measurement unit is equivalent to a basic circuit element. The basic circuit element is used to represent the coil inductance, the resistance along the direction of current flow, and the turn-to-turn resistance corresponding to the basic circuit element. Optionally, as shown in FIG. 3, a schematic diagram of a basic circuit element provided in an embodiment of the present application is provided, including:

an inductance 301, turn-to-turn resistance 302, superconducting layer resistance 303, and matrix layer resistance 304. The inductance 301 refers to the unit coil inductance when there is turn-to-turn insulation, and its inductance value represents the inductance value of the test coil.

The first end of the inductance 301 is connected to the first end of the turn-to-turn resistance 302, and its second end is connected to the first end of the superconducting layer resistance 303 and the first end of the matrix layer resistance 304; the second end of the turn-to-turn resistance 302 is connected to the second end of the superconducting layer resistance 303 and the second end of the matrix layer resistance 304.

The inductance value and resistance value are different for different measurement units, and the parameters corresponding to each component of the basic circuit elements can be adjusted to obtain the basic circuit elements corresponding to the measurement units.

S13: utilizing the multiple basic circuit elements to construct an equivalent circuit model.

The equivalent circuit model, also called as the coil equivalent circuit model, is used to measure parameters such as the TTR of the coil. The present application constructs an equivalent circuit model using multiple basic circuit elements.

The equivalent circuit model includes a unit set formed by connecting a plurality of measurement units in series and a DC power supply. The DC power supply is used to generate current for charging the coil. The unit set includes a first interface and a second interface; the first interface represents the current entering the unit set, and the second interface represents the current leaving the unit set.

The input end of the DC power supply is connected to the first interface, and the output end is connected to the second interface.

Figure 4A:
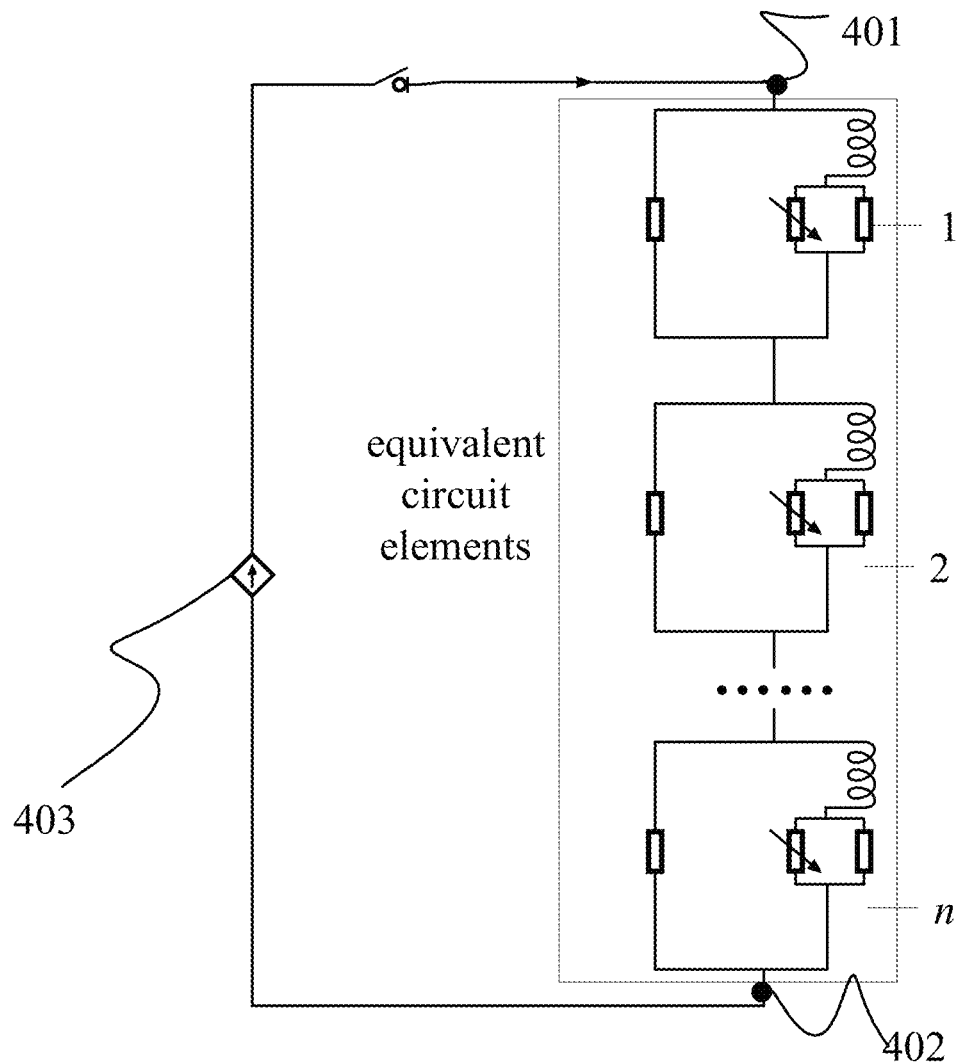
FIG. 4A is a schematic diagram of an adjusted equivalent circuit model provided in an embodiment of the present application.

FIG. 4A provides a schematic diagram of an adjusted equivalent circuit model provided in an embodiment of the present application.

The first interface 401 is connected to the input end of the DC power supply 403; the second interface 402 is connected to the output end of the DC power supply 403.

When the coil is a closed-loop coil, the equivalent circuit model also includes a persistent current switch (PCS). The PCS is made of superconducting tape. When in use, the PCS is first heated to locally quench, providing conditions for loading current. When the temperature of the PCS remains above 100K, the resistance of the PCS reaches its maximum value.

At this time, the unit set includes a first interface and a second interface; the first interface represents the current entering the unit set, and the second interface represents the current leaving the unit set; the input end of the DC power supply is connected to the first interface, and the output end is connected to the second interface; one end of the PCS is connected to the first interface, and the other end is connected to the second interface.

Figure 4B:
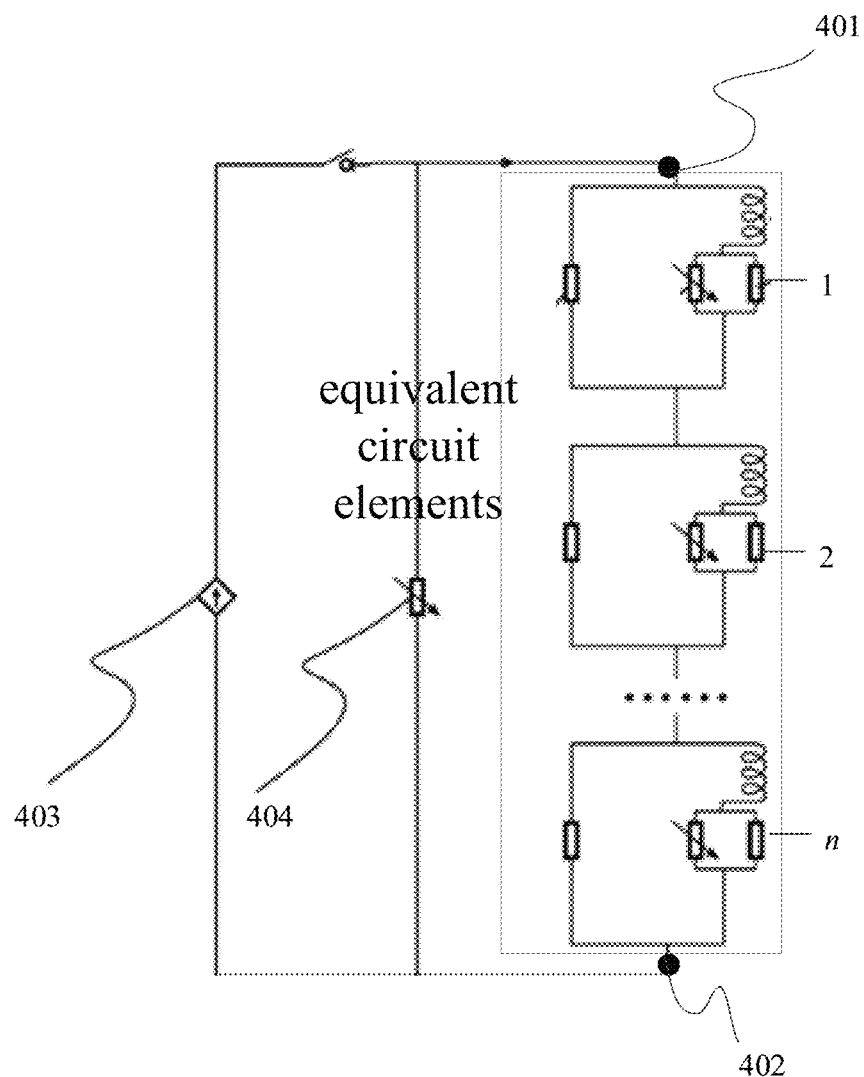
FIG. 4B is a schematic diagram of an adjusted equivalent circuit model provided in an embodiment of the present application.

FIG. 4B provides another schematic diagram of an adjusted equivalent circuit model provided in an embodiment of the present application.

The first interface 401 is connected to the input end of the DC power supply 403 and the first end of the PCS; the second interface 402 is connected to the output end of the DC power supply 403 and the second end of the PCS 404.

The unit set includes n (n>1, and n is a positive integer) basic circuit elements corresponding to a plurality of measurement units, where the first end of the turn-to-turn resistance of the first basic circuit element is the first interface, and the second end of the turn-to-turn resistance of the nth basic circuit element is the second interface. The second end of the turn-to-turn resistance of the first basic circuit element is connected to the first end of the turn-to-turn resistance of the second basic circuit element, the second end of the turn-to-turn resistance of the second basic circuit element is connected to the first end of the turn-to-turn resistance of the third basic circuit element, and so on until the second end of the turn-to-turn resistance of the (n−1)th basic circuit element is connected to the first end of the turn-to-turn resistance of the nth basic circuit element.

S14: obtaining multiple first simulated values based on the equivalent circuit model.

The first simulated values refer to the voltage values at different positions of the test coil obtained by the equivalent circuit model as the voltage varies over the preset time. The timestamps and positions of multiple first simulated values are aligned with those of multiple experimental values. Various methods can be employed to obtain multiple first simulated values in the present application.

In one optional implementation, the electronic device randomly inputs an TTR into the equivalent circuit model, and the equivalent circuit model outputs multiple first simulated values corresponding to that TTR.

In another optional implementation, the electronic device first inputs multiple experimental values into the equivalent circuit model, and the equivalent circuit model outputs multiple TTR for each measurement unit that match the experimental values as they change over the preset time. For each experimental value, one TTR is obtained. Within the preset time, the average of multiple TTRs for each measurement unit is calculated to obtain the first average TTR value for each measurement unit over the preset time.

The TTDR over the preset time is obtained. Then, within the preset time, the average of the TTDR for each measurement unit over the preset time is calculated. In this way, the TTDR within the coil is obtained. Finally, the first average TTR value is input into the equivalent circuit model to obtain multiple first simulated values.

In this embodiment, the purpose of the first simulated values is to replace experimental values. When the experimental values match the first simulated values, the TTR corresponding to the first simulated values is considered the TTR inside the test coil.

It is worth noting that the different positions mentioned in this embodiment correspond to the same positions as those of the experimental values.

S15: determining the TTRD within the test coil based on the fitness value between multiple experimental values and multiple first simulated values.

The TTRD within the test coil refers to an array composed of the TTR inside different measurement units of the coil and the corresponding unit numbers. For example, if there are 5 measurement units numbered 1, 2, 3, 4, 5, and the TTR inside each measurement unit are ρ1, ρ2, ρ3, ρ4, ρ5, then the formed array would be ((ρ1, 1), (ρ2, 2), (ρ3, 3), (ρ4, 4), (ρ5, 5)).

The fitness value is used to indicate the degree of fitness between the timestamps of multiple experimental values and multiple first simulated values with timestamps aligned. The higher the fitness between multiple experimental values and multiple first simulated values, the higher the fitness value, indicating that the first simulated values better represent the experimental values, and the TTRD represented by the first simulated values better reflects the TTRD within the test coil.

Optionally, the fitness value can be considered as the first objective function value, which can be obtained as follows:

determining multiple first fitting residual values based on multiple first simulated values and multiple experimental values, wherein each first fitting residual value represents the difference between a first simulated value and a corresponding experimental value at the same time;

calculating the sum of squares of multiple first fitting residual values to obtain the first objective function value.

Assuming Yexp represents experimental values and Ysim1 represents the first simulated values, then the first objective function value is given by:

$$(\Sigma(Y\text{sim1}-Y\text{exp})^2).$$

When the first objective function value is not greater than the target error value, the TTR corresponding to the first simulated values is considered the TTRD within the test coil.

Optionally, when the first objective function value is greater than the target error value, a preset iterative algorithm, is employed to iteratively extract the target TTR from a preset range of resistivity. The TTR is then input into the equivalent circuit model to obtain multiple second simulated values corresponding to the target TTR. The second objective function value corresponding to the second simulated values is iterated until the second objective function value is not greater than the target error value, at which point the TTR corresponding to the second simulated values is considered the TTRD within the test coil.

The second objective function value is determined by the steps as follows:

determining multiple second fitting residual values based on multiple second simulated values and multiple experimental values, wherein each second fitting residual value represents the difference between a second simulated value and a corresponding experimental value at the same time;

calculating the sum of squares of multiple second fitting residuals to obtain the second objective function value.

Assuming Yexp represents experimental values and Ysim2 represents the second simulated values, then the second objective function value is given by:

$$(\Sigma(Y\text{sim2}-Y\text{exp})^2)$$

The second simulated values refer to the voltage values varying over preset time at different positions of the test coil obtained when the TTR is re-entered into the equivalent circuit model after the first simulated value has a low degree of fitness with the experimental value. The timestamps of multiple second simulated values are aligned with those of multiple experimental values.

Optionally, the preset iterative algorithm can be a machine learning algorithm, such as a genetic algorithm (GA), gradient descent method, Newton's method, or Levenberg-Marquardt method, among others.

The present application provides a measurement method for the TTRD within a coil. The method includes obtaining multiple experimental values of the voltage varying over time at different positions of the test coil, then, dividing the test coil into multiple measurement units and obtaining multiple basic circuit elements, adjusting a preset equivalent circuit model including the basic circuit elements on an electronic device, performing electromagnetic simulations based on the equivalent circuit model to obtain multiple first simulated values representing the voltage varying over preset time at different positions of the test coil, and finally, determining the TTRD within the test coil based on the fitness values between multiple experimental values and multiple first simulated values. When the coil is non-uniform, there are differences in the experimental values obtained at different positions during charging or discharging. By adjusting the equivalent circuit model of the non-uniform coil on an electronic device, the first simulated values corresponding to the experimental values at different positions can be obtained. When the experimental values match the first simulated values, the TTR corresponding to the first simulated values (i.e., the experimental values) under the equivalent circuit model represents the TTR within the test coil, thus enabling the measurement of the non-uniform TTDR in NI high-temperature coils.

Additionally, this method does not cause destructive behavior to the coil and involves a non-contact measurement process, significantly reducing measurement costs. It is suitable for both HTS coils that have been wound but not yet assembled into finished magnets and HTS magnets that have been fully assembled and put into use.

Below, three exemplary embodiments are detailed to explain the method for measuring the TTRD within a coil provided by the present application.

Example One

This example focuses on a closed-loop NI HTS coil, the specific shape of which is shown in FIG. 2, which will not be described here.

Figure 5:
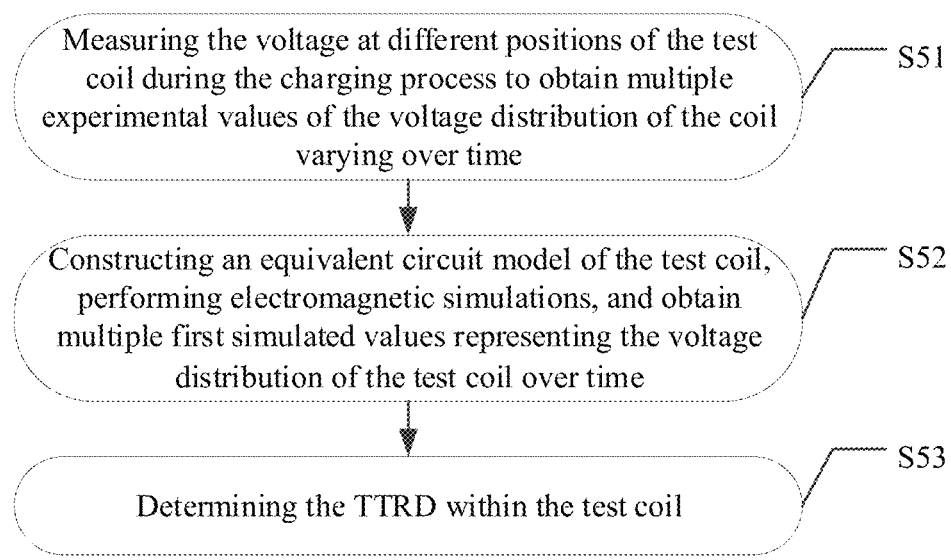
FIG. 5 is a flowchart of a first method for measuring the TTRD within a coil provided in an embodiment of the present application.

Refer to FIG. 5, which provides a flowchart of the first method for measuring the TTRD within the coil as provided in the application. This method specifically includes:

S51: measuring the voltage at different positions of the test coil during the charging process to obtain multiple experimental values of the voltage distribution of the coil varying over time.

The specific implementation is as follows:

Step One: heating the PCS of the test coil to achieve the preset resistance value. The preset resistance value is a value less than or equal to the maximum resistance value of the PCS, providing conditions for loading the current. The maximum resistance value refers to the resistance value reached by the PCS when its temperature is maintained above 100K.

Step Two: charging the test coil with a stable DC power supply. The DC power supply charges the test coil; cooling the PCS of the test coil to return it to the superconducting zero-resistance state when the output of the DC power supply remains at the preset steady current value for the preset holding time. After the charging process of the test coil stabilizes for the preset holding time, turn off the direct current power supply.

Example Scenario: The DC power supply first charges the coil at a rate of 0.5 A/s, maintains a constant output of 30 A (i.e., the preset steady current value) after 60 s, and the PCS of the test coil is cooled to restore it to the superconducting zero-resistance state after 20 min (i.e., the preset holding time). The DC power supply is then turned off after the charging process of the test coil stabilizes, completing the charging process.

Step Three: from the start of current flow through the test coil to the end of the transient charging process of the coil, collecting signals of voltage varying over time at different positions of the coil to obtain experimental values of the voltage distribution of the coil over time.

S52: constructing an equivalent circuit model of the test coil, performing electromagnetic simulations, and obtain multiple first simulated values representing the voltage distribution of the test coil over time.

Before constructing the equivalent circuit model, the test coil is first divided into five measurement units along the direction perpendicular to the winding direction of the test coil. Each measurement unit is equivalent to a basic circuit element. The number of turns in each basic circuit element corresponds to the distribution of measurement units, and the number of turns in each basic circuit element corresponds one-to-one with the number of turns between adjacent voltage measurement units when obtaining experimental values. Additionally, the TTR within each basic circuit element and the azimuthal current are equal everywhere.

Adjust the equivalent circuit model based on the characteristics of the basic circuit elements. Specifically, modifying the number of unit sets to five in the equivalent circuit model described in FIG. 4, and modifying the inductance and resistance parameters of each basic circuit element.

Using a preset iterative algorithm, continuously extract target TTR from the second preset resistance range, such as 0-100 $\mu\Omega \cdot cm^2$. Inputting each target TTR into the equivalent circuit model, performing simulations to obtain multiple first simulated values representing the voltage varying over preset time at different positions of the test coil.

S53: determining the TTRD within the test coil.

Calculating the differences between multiple first simulated values and multiple experimental values to obtain multiple first fitting residual values. Calculating the sum of squares of multiple first fitting residual values to determine the first objective function value. The first objective function value is positively correlated with the sum of squares of differences between experimental values and first simulated values. When the first objective function value is not greater than the target error value, terminate the iteration, and consider the TTR corresponding to the first objective function value as the TTR within the measurement unit, determining it as the TTRD within the test coil.

Figure 6:
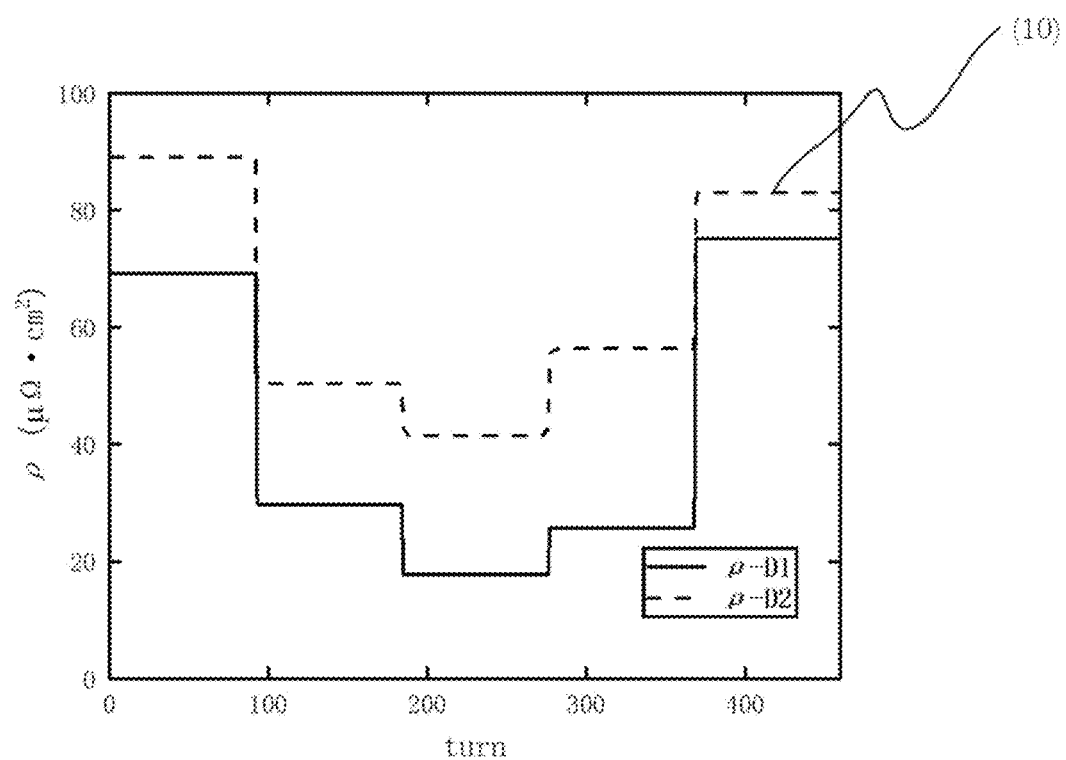
FIG. 6 is a schematic diagram of a second target TTRD provided in an embodiment of the present application.

Example Scenario: refer to FIG. 6, which provides a schematic diagram of the target TTRD. The target TTRs $\rho$-D1 and $\rho$-D2 are randomly extracted from the second preset resistivity range, and combined with different measurement unit numbers (turns) to form the TTRD. Different measurement unit numbers (turns) are represented by the number of turns, where turns 0-100 correspond to the first measurement unit, 100-200 correspond to the second measurement unit, 200-300 correspond to the third measurement unit, turns 300-400 correspond to the fourth measurement unit, and turns 400-500 correspond to the fifth measurement unit.

Figure 7:
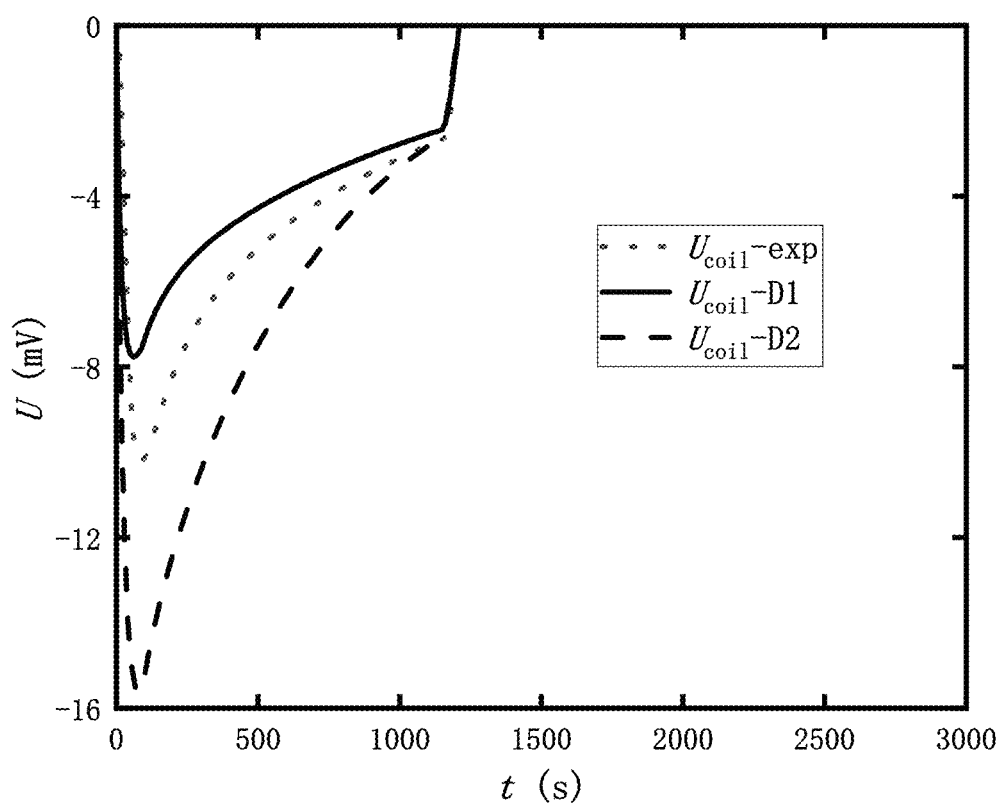
FIG. 7 is a schematic diagram of a first simulated value.

The target TTRs $\rho$-D1 and $\rho$-D2 are input into the preset equivalent circuit model to obtain multiple first simulated values representing the varying voltage of the coil during the charging process. Refer to FIG. 7, which illustrates a schematic of the first simulated values, where the horizontal axis represents voltage U in mV and the vertical axis represents preset time t in seconds. Ucoil-D1 represents a voltage simulation curve composed of multiple first simulated values corresponding to the target TTR $\rho$-D1. Ucoil-D2 represents a voltage simulation curve composed of multiple first simulated values corresponding to the target TTR $\rho$-D2. Additionally, the figure includes multiple experimental values Ucoil-exp corresponding to the same positions and the same preset times.

Through the first objective function value, it can be determined that the first objective function value obtained for $\rho$-D1 satisfies the iteration condition, i.e., it is not greater than the target error value. Therefore, the TTRD corresponding to $\rho$-D1 is considered as the TTRD within the test coil.

In this exemplary embodiment, the application iteratively extracts target TTR from the second preset resistivity range according to the preset iterative algorithm. Among these, it selects multiple target TTR that correspond most closely to the experimental values from the multiple first simulated values, considering these as the TTRD within the test coil.

Example Two

While Example One can accurately obtain the TTRD within the coil when the coil is non-uniform, it requires multiple searches to obtain accurate TTR, resulting in complex calculations and low computational efficiency.

Based on this, Example Two provides a second method for measuring the TTRD within the coil. In this method, the test coil is divided into different measurement units along the direction perpendicular to the winding direction of the coil within the coil plane for measurement. The test coil is an artificially constructed mock open-loop NI HTS coil with a known TTRD. The coil shape and arrangement of voltage measuring components are the same as in FIG. 2, and are not reiterated here.

Figure 8:
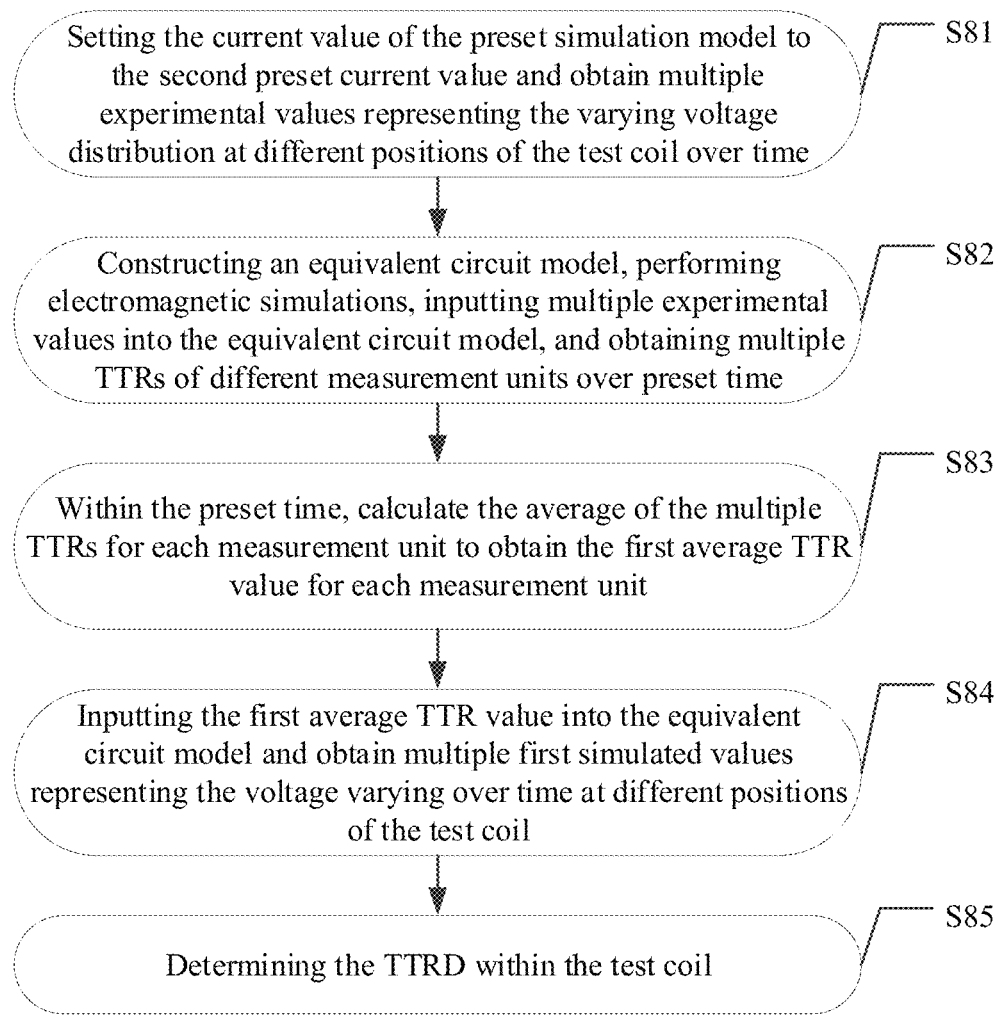
FIG. 8 is a third method for measuring the TTRD within a test coil provided in an embodiment of the present application.

Refer to FIG. 8, which provides the second method for measuring the TTRD within the test coil according to Example Two. This method includes:

S81: setting the current value of the preset simulation model to the second preset current value and obtain multiple experimental values representing the varying voltage distribution at different positions of the test coil over time;

creating a simulation model on the electronic device, which includes a DC power supply and a mock coil corresponding to the test coil, for collecting voltage values of the test coil at different time points;

adjusting the current value of the simulation model to the second preset current value, for example, under a mock charging state of 20 A, to measure the mock coil. The mock coil is divided into measurement units, with every fifty turns constituting one measurement unit, and the preset voltage acquisition period is 10 s. This process obtains multiple experimental values representing the varying voltage distribution at different positions of the test coil over time.

S82: constructing an equivalent circuit model, performing electromagnetic simulations, inputting multiple experimental values into the equivalent circuit model, and obtaining multiple TTRs of different measurement units over preset time.

The specific adjustment method is the same as step S12, and is not reiterated here.

Input multiple experimental values representing the varying voltage distribution at different positions of the test coil over time into the equivalent circuit model. Based on the ordinary differential equations constructed according to Kirchhoff's law satisfied by the equivalent circuit model, calculate and obtain multiple TTRs of different measurement units over time.

S83: within the preset time, calculate the average of the multiple TTRs for each measurement unit to obtain the first average TTR value for each measurement unit.

Example Scenario: if there are two measurement units, named 'a' and 'b', and the multiple first variation values of the TTR over time for measurement unit 'a' are assumed to be a1, a2, a3, a4, a5, a6, a7, and a8, then the first average TTR for measurement unit 'a' would be (a1+a2+a3+a4+a5+a6+a7+a8)/8. Similarly, if the multiple first variation values of the TTR over time for measurement unit 'b' are assumed to be b1, b2, b3, b4, b5, b6, b7, and b8, then the first average TTR for measurement unit 'b' would be (b1+b2+b3+b4+b5+b6+b7+b8)/8.

The first average TTR for each measurement unit approximates the TTR within the test coil. Optionally, the first average TTR can be considered as the TTRD within the coil.

In another feasible approach, if considering the first average TTR as the TTRD within the coil introduces some errors, to further improve the accuracy of obtaining the TTRD within the test coil, proceed to step S84.

S84: inputting the first average TTR value into the equivalent circuit model and obtain multiple first simulated values representing the voltage varying over time at different positions of the test coil;

inputting the first average TTR for each measurement unit into the equivalent circuit model to obtain multiple first simulated values representing the voltage varying over time at different positions of the test coil.

S85: determining the TTRD within the test coil.

determining multiple first fitting differences based on multiple first simulated values and multiple experimental values, calculating the sum of squares of multiple first fitting residual values to determine the first objective function value, wherein the first objective function value is positively correlated with the sum of squares of multiple first fitting differences.

When the first objective function value is not greater than the target error value, consider each measurement unit's first average TTR as the TTR within the measurement unit, obtaining the TTRD within the test coil.

Optionally, if the first objective function value is greater than the target error value, indicating low accuracy when using the first average TTR as the coil's TTR, proceed to improve accuracy through a preset iterative algorithm, such as a GA, for optimizing and fitting the experimental values. The specific optimization method is as follows:

Based on the preset iterative algorithm, repeatedly obtain the second objective function value until it is not greater than the target error value. Consider the TTR corresponding to the second objective function value for each measurement unit as the TTR within the measurement unit, determining the TTRD within the test coil.

The initial value of the preset iterative algorithm is the first average TTR, and the independent variable range is the first preset resistivity range based on the first average TTR. The specific method of obtaining the second objective function value is the same as step S15, and is not elaborated here.

The first preset resistivity range is smaller than the second preset resistivity range. Therefore, it is only necessary to consider the fluctuation range of the first average TTR. For example, if the first average TTR is represented by $\rho$, then the first preset resistance range can be defined as $[\rho-a, \rho+a]$.

It is important to emphasize that the first preset resistivity range is a subset of the second preset resistivity range. By reducing the scope of random searches, the number of iterations is decreased, thereby improving computational efficiency.

In this embodiment, the measurement method can be validated by inputting a known coil with known TTRD (such as an artificially constructed mock closed-loop NI HTS coil), specifically including:

utilizing the method illustrated in FIG. 8 to obtain the TTRD within the test coil, then comparing the obtained TTRD with the known TTRD to determine the accuracy of the method in reproducing the TTRD.

Optionally, the number of turns in the measurement unit and the sampling period can be adjusted to explore the effects of measurement unit precision and voltage sampling period on the accuracy of the TTRD.

Figure 9A:
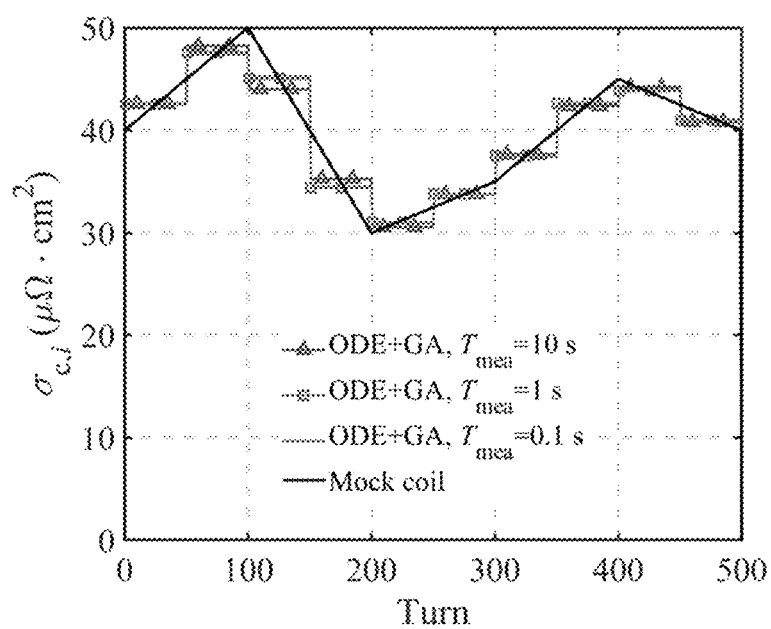
FIG. 9A is a comparison of the obtained results of the TTR for a measurement unit with 50 turns provided in an embodiment of the present application.
Figure 9B:
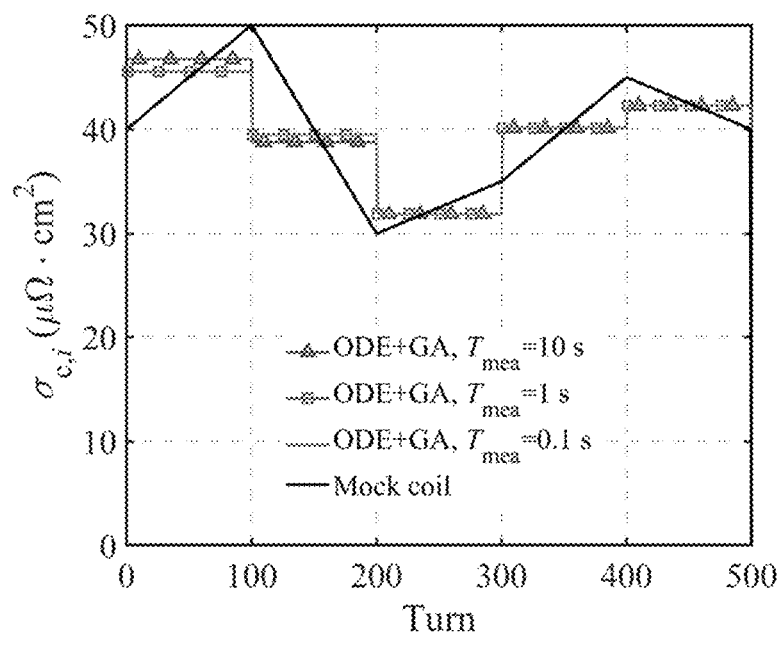
FIG. 9B is a comparison of the obtained results of the TTR for a measurement unit with 100 turns provided in an embodiment of the present application.
Figure 9C:
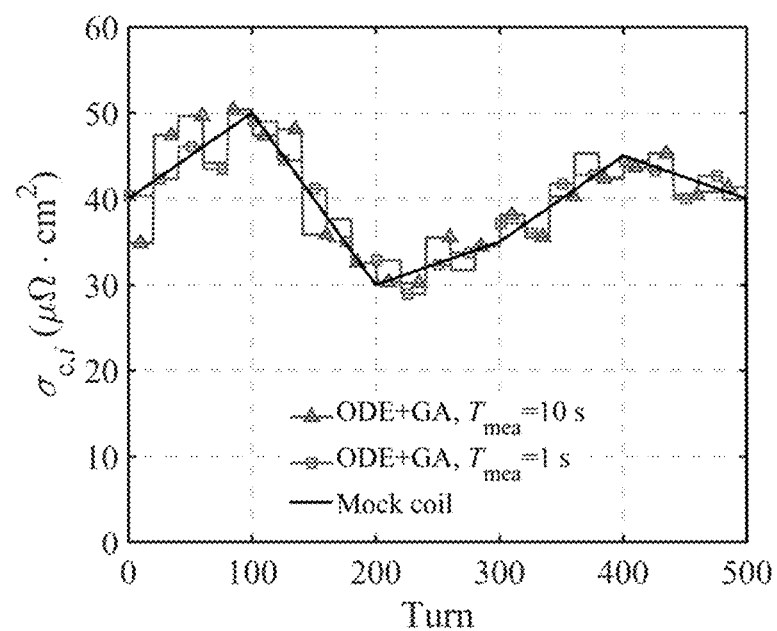
FIG. 9C is a comparison of the obtained results of the TTR for a measurement unit with 20 turns provided in an embodiment of the present application.

Example Scenario: refer to FIGS. 9A-9C, which show the results of the TTRD comparison when the number of turns in the measurement unit is 50, 100, and 20, and the preset voltage sampling periods are 10 s, 1 s, and 0.1 s respectively. In these figures, the vertical axis represents the TTR $\delta c,i$ in $\mu\Omega\cdot cm^2$, and the horizontal axis represents the different measurement unit numbers (turn). "Mockcoil" represents the mock coil with known TTRD, "ODE+GA" represents the combination of ordinary differential equation method and genetic algorithm, "Tmea=10 s" represents a voltage sampling period of 10 s, "Tmea=1 s" represents a voltage sampling period of 1 s, and "Tmea=0.1 s" represents a voltage sampling period of 0.1 s.

By comparing FIGS. 9A, 9B, and 9C, it can be observed that the lower the number of turns in the measurement unit, the higher the reproduction accuracy. The effect of the voltage sampling period on the reproduction accuracy is not significant. When the number of turns in the measurement unit is 20 and the voltage sampling period is set to 1 s, the obtained TTRD has the highest reproduction accuracy compared to the known TTRD.

This embodiment not only enhances the accuracy of measuring the non-uniform TTRD in the test coil but also improves computational efficiency. By verifying the obtained TTRD against the known TTRD, the accuracy of this method in measuring the non-uniform TTRD in the test coil can be further validated.

Example Three

This embodiment describes a measurement method for the TTRD within a test coil during the discharging process. The test coil is a single pancake open-loop NI HTS coil.

Firstly, the measurement method includes:

obtaining experimental values of the voltage distribution varying over the preset time at different positions within the test coil, and the experimental values of the magnetic field distribution varying over time at different positions;

arranging voltage measurement components and magnetic field measurement components, and utilizing an external DC power supply with a predetermined first current value (e.g., 20 A) to charge the test coil; after ensuring that the current inside the coil is uniform, deactivating the external DC power supply to conduct a discharging experiment, and obtaining experimental values of voltage and magnetic field varying over the preset time at different positions of the test coil during the discharging process;

then adjusting the equivalent circuit model of the coil and performing electromagnetic simulation; inputting the experimental values of voltage distribution into the equivalent circuit model to obtain multiple first variation values of equivalent TTR for different measurement units over the measurement time; within the preset time, averaging the multiple first variation values for each measurement unit to obtain the first average TTR value; inputting these first average TTR values into the equivalent circuit model to obtain the first simulated values of the test coil's voltage distribution varying over preset time at different positions, thus determining the TTRD inside the test coil (for detailed implementation, see steps S82-S85, which are not elaborated here).

Once the TTRD inside the test coil is obtained, input the obtained TTRD into the equivalent circuit model to obtain the simulated values of voltage distribution and magnetic field distribution varying over time at different positions inside the coil during the discharging process.

The simulated values of voltage distribution include the first simulated values and second simulated values mentioned in steps S82-S85, which are not discussed further here.

Compare the simulated values of voltage distribution with the experimental values and compare the experimental values of magnetic field distribution with the simulated values to evaluate the predictive accuracy of the measured coil's TTRD for changes in coil voltage and magnetic field distribution. Additionally, by changing the discharging conditions and repeating the above measurement method, the predictive accuracy of the method for the operating characteristics of the coil under different discharging conditions can be verified.

This method is applicable not only to discharging conditions but also to charging conditions.

Figure 10:
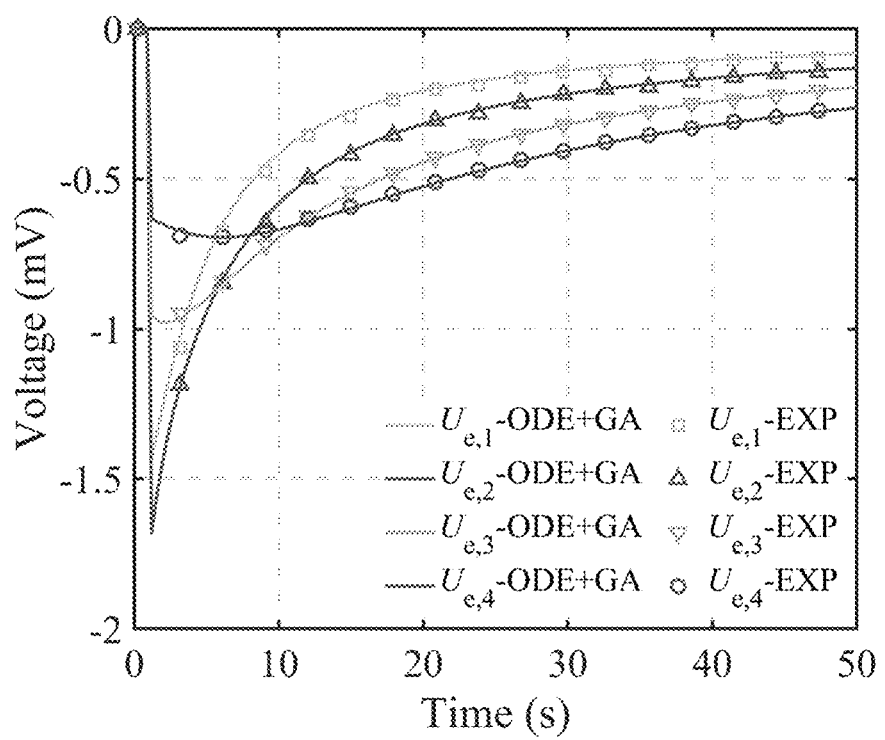
FIG. 10 is a schematic diagram of the comparison results between the simulated voltage values obtained from different DC power supplies and the experimental voltage distribution during the discharging process.

Example Scenario: refer to FIG. 10, which shows a comparison of the simulated values and experimental values of voltage distribution under discharging conditions when the external DC power supply is 20 A over a predetermined time of 50 s. The ordinate represents voltage (unit: mV), ranging from −2 to 0 mV, and the abscissa represents time (unit: s).

U e-1-ODE+GA to U e-4-ODE+GA represent the simulated voltage distribution values obtained by combining the ordinary differential equation method with genetic algorithm under different conditions, while U e-1-EXP to U e-4-EXP represent the experimental voltage distribution values under different conditions.

Figure 11:
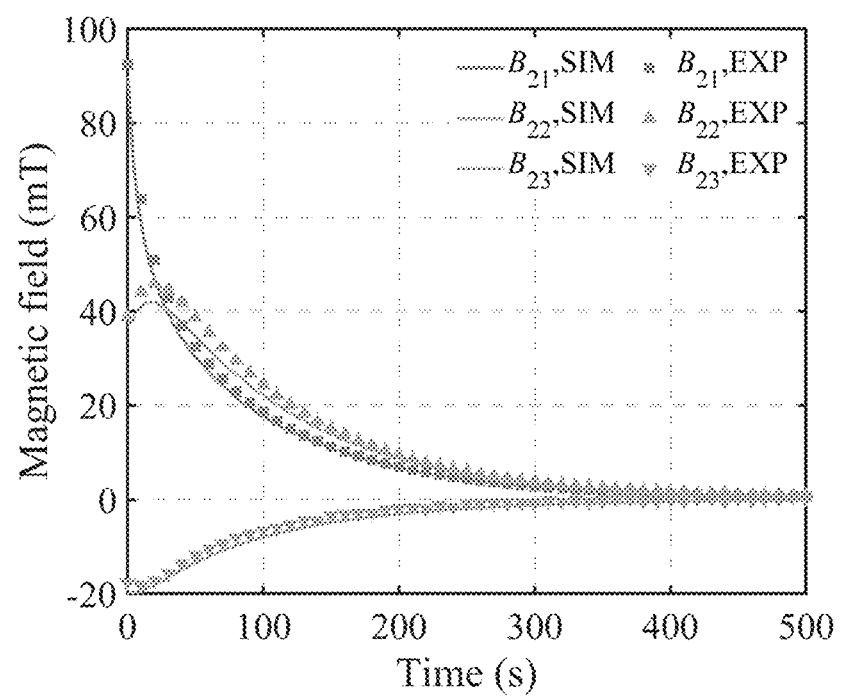
FIG. 11 is a schematic diagram of the comparison results between the simulated magnetic field distribution values obtained from different DC power supplies and the experimental magnetic field distribution during the discharging process.

Refer to FIG. 11, which illustrates a comparison of simulated values and experimental values of magnetic field distribution varying over preset time (50 s) under discharging conditions when the external DC power supply is 20 A. The ordinate represents magnetic field distribution (unit: Magnetic field), and the abscissa represents time (unit: s). B21SIM-B23SIM represents the simulated magnetic field distribution under different conditions, and B21EXP-B23EXP represents the experimental magnetic field distribution under different conditions.

This embodiment of the present application also provides corresponding apparatuses and a computer-readable medium for implementing the non-destructive measurement method for TTRD in NI of insulated superconducting coils.

The apparatuses include a memory and a processor, wherein the memory is used to store instructions or codes, and the processor is used to execute the instructions or codes to enable the equipment to execute one of the non-destructive measurement methods for the TTRD in the NI superconducting coils provided in any of the application embodiments.

In practical applications, the computer-readable storage medium may consist of one or more combinations of computer-readable media. The computer-readable medium can be in the form of a computer-readable signal medium or computer-readable storage medium. For example, the computer-readable storage medium can be, but are not limited to, systems, devices, or apparatuses involving electrical, magnetic, optical, electromagnetic, infrared, or semiconductor technologies, or any combination thereof. More specific examples (non-exhaustive list) of computer-readable storage media include: electrical connections with one or more conductors, portable computer disks, hard drives, Random Access Memory (RAM), Read-Only Memory (ROM), Erasable Programmable Read-Only Memory (EPROM or flash memory), optical fibers, portable compact disk read-only memory (CD-ROM), optical storage devices, magnetic storage devices, or any suitable combination thereof. In this embodiment, the computer-readable storage medium can be any tangible medium containing or maintaining a program that can be used by instruction execution systems, devices, or apparatuses or in combination with them.

Computer-readable signal media may include data signals propagated in baseband or as part of a carrier that carries computer-readable program codes. Such propagated data signals can take various forms, including but not limited to electromagnetic signals, optical signals, or any suitable combination thereof. Computer-readable signal media may also be any computer-readable medium other than computer-readable storage media, which can transmit, propagate, or transport programs for use by instruction execution systems, devices, or apparatuses or in combination with them.

Program codes contained on computer-readable media can be transmitted using any appropriate medium, including but not limited to wireless, wired, optical cable, RF, or any suitable combination thereof.

Computer program codes for executing the operations of the present invention may be written in one or more programming languages, including object-oriented programming languages such as Java, Smalltalk, C++, and conventional procedural programming languages such as "C" language or similar programming languages. The program codes can be executed entirely or partially on a user's computer, as a standalone software package, partially on a user's computer and partially on a remote computer, or entirely on a remote computer or server. In scenarios involving remote computers, the remote computer can be connected to the user's computer via any type of network, including a Local Area Network (LAN) or Wide Area Network (WAN), or can be connected to an external computer (e.g., via the Internet using an Internet Service Provider).

Furthermore, in this document, relational terms such as "first" and "second" are used solely to distinguish one entity or operation from another, without necessarily implying any actual relationship or order between them. Additionally, terms such as "including", "comprising", or any other variant thereof are intended to encompass non-exclusive inclusion, so that a process, method, item, or device including a series of elements includes not only those elements explicitly listed, but also includes other elements not explicitly listed, or includes elements inherent to such process, method, item, or device. In the absence of further limitations, the element limited by the statement "including one . . ." does not exclude the presence of additional identical elements in the process, method, item, or device including the said element.

The foregoing is merely a specific embodiment of the present application, and the scope of protection of the present application is not limited thereto. Any changes or substitutions readily conceivable by those skilled in the art within the technical scope disclosed in the present application should be encompassed within the scope of protection of the present application. Therefore, the scope of protection of the present application should be determined by the scope of protection of the claims.

What is claimed is:

1. A non-destructive measurement method for the turn-to-turn resistivity distribution (TTRD) in non-insulation (NI) superconducting coils, the method comprising:
    obtaining multiple experimental values of voltage varying over preset time at different positions of the test coil during the discharging or charging process, wherein the test coil is an NI high-temperature superconducting (HTS) coil;
    dividing the test coil into a plurality of measurement units and obtaining a plurality of basic circuit elements; each basic circuit element corresponds to a measurement unit and is used to represent the coil inductance of the measurement unit, the resistance of the coil in the direction of current flow in the measurement unit, and the turn-to-turn resistance of the measurement unit;
    constructing an equivalent circuit model using the multiple basic circuit elements; and based on the equivalent circuit model, obtaining multiple first simulated values of voltage varying over preset time at different positions of the test coil; aligning the timestamps of the multiple first simulated values with the multiple experimental values; and
    determining the TTRD of the test coil based on the fitness value between the multiple experimental values and the multiple first simulated values; wherein the fitness value represents the fitness value between the multiple experimental values and the multiple first simulated values; and the TTRD is an array composed of turn-to-turn resistivity (TTR) within different measurement units and the numbers of the measurement units; the TTR within a measurement unit is obtained by multiplying the turn-to-turn resistance within the measurement unit by the turn-to-turn contact area within the measurement unit;
    wherein the step of obtaining multiple first simulated values of voltage varying over preset time at different positions of the test coil based on the equivalent circuit model comprises:
        inputting the multiple experimental values into the equivalent circuit model to obtain multiple TTR values for each measurement unit over the preset time;
        one experimental value corresponds to one TTR value;
        averaging the multiple TTR values for each measurement unit over the preset time to obtain the first average TTR value for each measurement unit within the preset time; and
        inputting the first average TTR value for each measurement unit into the equivalent circuit model to obtain multiple first simulated values of voltage variation over preset time at different positions of the test coil.

2. The method according to claim 1, wherein the equivalent circuit model where the test coil is an open-loop coil comprises:
    a DC power supply; and
    a unit set formed by serially connecting the multiple basic circuit units;
    wherein the DC power supply supplies power to the equivalent circuit model;
    the unit set includes a first interface and a second interface; the first interface represents the current flowing into the unit set, and the second interface represents the current flowing out of the unit set; and
    the input end of the DC power supply is connected to the first interface, and the output end is connected to the second interface.

3. A non-destructive measurement method for the TTRD in NI superconducting coils, the method comprising:
    obtaining multiple experimental values of voltage varying over preset time at different positions of the test coil during the discharging or charging process, wherein the test coil is an NI HTS coil;
    dividing the test coil into a plurality of measurement units and obtaining a plurality of basic circuit elements; each basic circuit element corresponds to a measurement unit and is used to represent the coil inductance of the measurement unit, the resistance of the coil in the direction of current flow in the measurement unit, and the turn-to-turn resistance of the measurement unit;
    constructing an equivalent circuit model using the multiple basic circuit elements; and based on the equivalent circuit model, obtaining multiple first simulated values of voltage varying over preset time at different positions of the test coil; aligning the timestamps of the multiple first simulated values with the multiple experimental values; and
    determining the TTRD of the test coil based on the fitness value between the multiple experimental values and the multiple first simulated values; wherein the fitness value represents the fitness value between the multiple experimental values and the multiple first simulated values; and the TTRD is an array composed of TTR within different measurement units and the numbers of the measurement units; the TTR within a measurement unit is obtained by multiplying the turn-to-turn resistance within the measurement unit by the turn-to-turn contact area within the measurement unit;
    wherein the equivalent circuit model where the test coil is a closed-loop coil comprises:
        a DC power supply, a persistent current switch (PCS), and a unit set formed by serially connecting the basic circuit elements of the multiple measurement units;
        wherein the DC power supply supplies power to the equivalent circuit model; the PCS is used to make the unit set operate in a closed loop; and
        the input end of the DC power supply is connected to the first interface, and the output end is connected to the second interface; one end of the PCS is connected to the first interface, and the other end is connected to the second interface.

4. The method according to claim 3, wherein the step of determining the TTRD of the test coil based on the fitness value between the multiple experimental values and the multiple first simulated values comprises:

determining multiple first fitting residual values based on the multiple first simulated values and the multiple experimental values; one first fitting residual value is the difference between one first simulated value and one experimental value at the same time;

computing the sum of squares of the multiple first fitting residual values to determine the first objective function value; the first objective function value is positively correlated with the sum of squares of the multiple first fitting residual values;

when the first objective function value is not greater than a target error value, considering the first average TTR value for each measurement unit as the TTR within the measurement unit and determining the TTRD of the test coil; and when the first objective function value is greater than the target error value, iterating to obtain the second objective function value based on a preset iterative algorithm until the second objective function value is not greater than the target error value; considering the second objective function value corresponding to each measurement unit as the TTR within the measurement unit and determining the TTRD of the test coil;

wherein the initial value of the preset iterative algorithm is the first average TTR value, and the independent variable range is the first preset resistivity range based on the first average TTR value; the second objective function value is used to represent the sum of squares of multiple second fitting residual values obtained by multiple second simulated values corresponding to the TTR and experimental values during the iteration process, where the second fitting residual value is the difference between one second simulated value and one experimental value at the same time.

5. The method according to claim 1, wherein the step of obtaining the second objective function value comprises:

when extracting the target TTR from the second preset resistivity range, inputting the target TTR into the equivalent circuit model to obtain multiple second simulated values of voltage varying over preset time at different positions of the test coil corresponding to the target TTR;

determining multiple second fitting residual values based on the multiple second simulated values and the multiple experimental values; and computing the sum of squares of the multiple second fitting residual values to determine the second objective function value.

6. A non-destructive measurement method for TTRD in NI superconducting coils, the method comprising:

obtaining multiple experimental values of voltage varying over preset time at different positions of the test coil during the discharging or charging process, wherein the test coil is an NI HTS coil;

dividing the test coil into a plurality of measurement units and obtaining a plurality of basic circuit elements; each basic circuit element corresponds to a measurement unit and is used to represent the coil inductance of the measurement unit, the resistance of the coil in the direction of current flow in the measurement unit, and the turn-to-turn resistance of the measurement unit;

constructing an equivalent circuit model using the multiple basic circuit elements; and based on the equivalent circuit model, obtaining multiple first simulated values of voltage varying over preset time at different positions of the test coil; aligning the timestamps of the multiple first simulated values with the multiple experimental values;

determining the TTRD of the test coil based on the fitness value between the multiple experimental values and the multiple first simulated values; wherein the fitness value represents the fitness value between the multiple experimental values and the multiple first simulated values; and the TTRD is an array composed of TTR within different measurement units and the numbers of the measurement units; the TTR within a measurement unit is obtained by multiplying the turn-to-turn resistance within the measurement unit by the turn-to-turn contact area within the measurement unit;

wherein the step of determining the TTRD of the test coil based on the fitness value between the multiple experimental values and the multiple first simulated values comprises:

using a preset iterative algorithm to continuously extract the target TTR from the second preset resistivity range, inputting the target TTR into the equivalent circuit model to obtain multiple first simulated values of voltage varying over preset time at different positions of the test coil;

calculating multiple first fitting residual values between the multiple experimental values and the multiple first simulated values; one first fitting residual value is the difference between one experimental value and one first simulated value at the same time; and when the first objective function value is not greater than the target error value, the preset iterative algorithm stops, and the TTR corresponding to the first objective function value is considered as the TTR within the measurement unit, determining the TTRD of the test coil.

7. The method according to claim 1, wherein the step of dividing the test coil into a plurality of measurement units comprises:

dividing the test coil based on the spatial measurement accuracy of the preset TTRD, wherein the test coil is divided perpendicular to the direction of winding of the test coil tape to obtain the plurality of measurement units;

wherein the spatial measurement accuracy of the TTRD is positively correlated with the number of measurement units.

8. The method according to claim 1, wherein the basic circuit element comprises:

an inductance,
a turn-to-turn resistance,
a superconducting layer resistance, and
a matrix layer resistance;
wherein the inductance value of the inductance represents the inductance value of the coil, with the first end of the inductance connected to the first end of the turn-to-turn resistance and the second end connected to the first end of the superconducting layer resistance and the first end of the matrix layer resistance; and the second end of the turn-to-turn resistance is connected to the second end of the superconducting layer resistance and the second end of the matrix layer resistance.

9. The method according to claim 1, wherein the structure of the test coil comprises one or more of the following: closed-loop, open-loop, single-pancake, double-pancake.

10. A non-destructive measurement apparatus for the TTRD in NI superconducting coils, comprising:
   a memory; and
   a processor coupled to the memory;
   wherein the memory stores program instructions, when executed by the processor, cause the apparatus to perform the method according to claim 1.

11. A computer-readable storage medium comprising computer-readable instructions, wherein when the computer-readable instructions are executed on a computing device, the computing device performs the method according to claim 1.

* * * * *